US008907562B2

(12) United States Patent
Kim et al.

(10) Patent No.: US 8,907,562 B2
(45) Date of Patent: Dec. 9, 2014

(54) ORGANIC LIGHT EMITTING DIODES DISPLAY AND METHOD OF MANUFACTURING THE SAME

(71) Applicant: Samsung Display Co., Ltd., Yongin, Gyeonggi-Do (KR)

(72) Inventors: Hun Kim, Yongin (KR); Jin-Woo Park, Yongin (KR); Jai-Hyuk Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/016,053

(22) Filed: Aug. 31, 2013

(65) Prior Publication Data

US 2014/0167603 A1 Jun. 19, 2014

(30) Foreign Application Priority Data

Dec. 14, 2012 (KR) ........................ 10-2012-0146636

(51) Int. Cl.
*H01L 51/54* (2006.01)
*H05B 33/10* (2006.01)
*H05B 33/04* (2006.01)

(52) U.S. Cl.
CPC ................ *H05B 33/04* (2013.01); *H05B 33/10* (2013.01)
USPC .............................. 313/512; 313/504; 445/25

(58) Field of Classification Search
CPC C09K 11/06; H01L 2251/5361; H01L 51/52; H01L 51/5259; H01L 2251/306; H01L 51/5243; H05B 33/04; H05B 33/20; F12Y 2105/008
USPC .................................................. 313/498–512
See application file for complete search history.

(56) References Cited

U.S. PATENT DOCUMENTS

| | | | | |
|---|---|---|---|---|
| 7,722,929 | B2 | 5/2010 | Aitken et al. | |
| 8,354,287 | B2 | 1/2013 | Sasaki et al. | |
| 2007/0040501 | A1 | 2/2007 | Aitken et al. | |
| 2012/0028011 | A1* | 2/2012 | An et al. | 428/213 |
| 2012/0241811 | A1 | 9/2012 | Kim et al. | |
| 2012/0242221 | A1 | 9/2012 | Kim et al. | |

FOREIGN PATENT DOCUMENTS

| | | | |
|---|---|---|---|
| KR | 10-2008-0045217 | A | 5/2008 |
| KR | 10-2008-0080019 | A | 9/2008 |
| KR | 10-2010-0050470 | A | 5/2010 |
| KR | 10-2010-0053534 | A | 5/2010 |
| KR | 10-2012-0107331 | A | 10/2012 |
| KR | 10-2012-0109083 | A | 10/2012 |
| WO | WO 2008/156762 | A1 | 12/2008 |

OTHER PUBLICATIONS

Registration Determination Certificate mailed on May 23, 2014 in corresponding Korean Patent Application No. 10-2012-0146636.

* cited by examiner

*Primary Examiner* — Donald Raleigh
(74) *Attorney, Agent, or Firm* — Lee & Morse, P.C.

(57) ABSTRACT

An organic light emitting diode display includes a substrate, an organic light emitting unit disposed on the substrate and including a laminate of a first electrode, an organic emission film, and a second electrode, a first inorganic film formed on the substrate to cover the organic light emitting unit, the first inorganic film including $SnO_2$, and a second inorganic film formed on the first inorganic film, the second inorganic film including $SnO_2$ at a top surface and including SnO, a proportion of the SnO increasing in a direction from the top surface of the second inorganic film toward the first inorganic film.

16 Claims, 1 Drawing Sheet

ORGANIC LIGHT EMITTING DIODES DISPLAY AND METHOD OF MANUFACTURING THE SAME

CROSS-REFERENCE TO RELATED APPLICATION

This application claims priority to and the benefit of Korean Patent Application No. 10-2012-0146636, filed on Dec. 14, 2012, in the Korean Intellectual Property Office, and entitled: "ORGANIC LIGHT EMITTING DIODES DISPLAY AND METHOD OF MANUFACTURING THE SAME," which is incorporated by reference herein in its entirety

BACKGROUND

1. Field

Embodiments relate to an organic light emitting diode (OLED) display and a method of manufacturing the same.

2. Description of the Related Art

Since organic light emitting diode (OLED) displays feature excellent viewing angles, contrast, response speeds, and power consumption, applicable fields thereof have been expanded from personal portable devices such as MP3 players and cellular phones to televisions.

SUMMARY

Embodiments are directed to an organic light emitting diode display, including a substrate, an organic light emitting unit disposed on the substrate and including a laminate of a first electrode, an organic emission film, and a second electrode, a first inorganic film formed on the substrate to cover the organic light emitting unit, the first inorganic film including $SnO_2$, and a second inorganic film formed on the first inorganic film, the second inorganic film including $SnO_2$ at a top surface and including SnO, a proportion of the SnO increasing in a direction from the top surface of the second inorganic film toward the first inorganic film.

The first inorganic film and the second inorganic film may further include one or more of $P_2O_5$, $BPO_4$, $SnF_2$, or $WO_3$.

The second inorganic film may be formed to cover the first inorganic film and the substrate.

The second inorganic film may be formed directly on the first inorganic film

The first inorganic film and the second inorganic film may have a phase transition temperature from a solid state to a liquid state that is lower than a modification temperature of the organic emission film.

The first inorganic film and the second inorganic film may be treated by melting and solidification.

The first inorganic film may have a thickness of about 100 nm to about 500 nm.

Embodiments are also directed to a method of manufacturing an organic light emitting diode display, the method including forming an organic light emitting unit on a substrate, forming a first inorganic film by using a low-temperature phase transition (LPT) inorganic material under oxygenic conditions to cover the organic light emitting unit, and forming a second inorganic film on the first inorganic film by using the LPT inorganic material under anoxic conditions.

The first inorganic film may include $SnO_2$.

The LPT inorganic material may include SnO, SnO and $P_2O_5$, SnO and $BPO_4$, SnO, $SnF_2$, and $P_2O_5$, SnO, $SnF_2$, $P_2O_5$, and NbO, or SnO, $SnF_2$, $P_2O_5$, and $WO_3$.

The forming of the first inorganic film and the forming of the second inorganic film may be performed by one or more of a sputtering method, a vapor deposition method, a low-temperature deposition method, a plasma-enhanced chemical vapor deposition method, a plasma ion-assisted deposition method, an electron beam coating method, or an ion plating method.

The first inorganic film may be formed using the sputtering method, and, in the forming of the first inorganic film using the sputtering method, a ratio between injection amounts of oxygen and argon may be about 0.005 to about 1:1.

A top surface of the second inorganic film may be oxidized by oxygen in air.

The first inorganic film may have a thickness of about 100 nm to about 500 nm.

The method may further include, after the forming of the second inorganic film, performing a healing process of providing fluidity to the first inorganic film and the second inorganic film by heating the first inorganic film and the second inorganic film at a temperature higher than a phase transition temperature thereof, and performing a post-treatment process on the display.

The post-treatment process may include one or more of a chemical treatment, a plasma treatment, a high-temperature oxygenic chamber treatment, a high-temperature moisture chamber treatment, or a surficial doping.

BRIEF DESCRIPTION OF THE DRAWINGS

The above and other features and advantages will become more apparent by describing in detail example embodiments with reference to the attached drawings in which.

DETAILED DESCRIPTION

Figure 1:
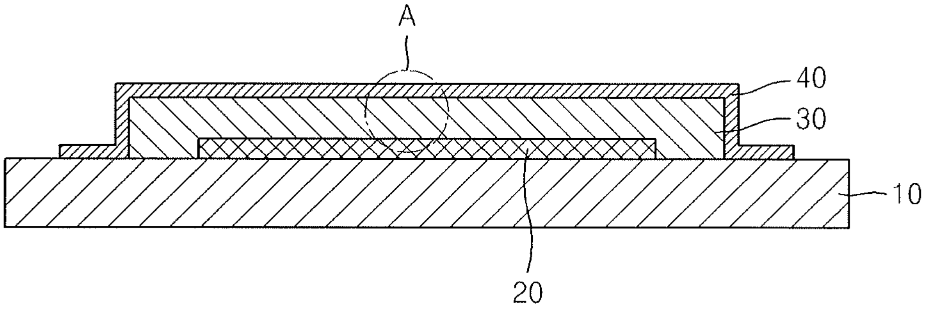
FIG. 1 is a schematic cross-sectional view illustrating an organic light emitting diode (OLED) display according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

As used herein, the term "and/or" includes any and all combinations of one or more of the associated listed items.

Figure 2:
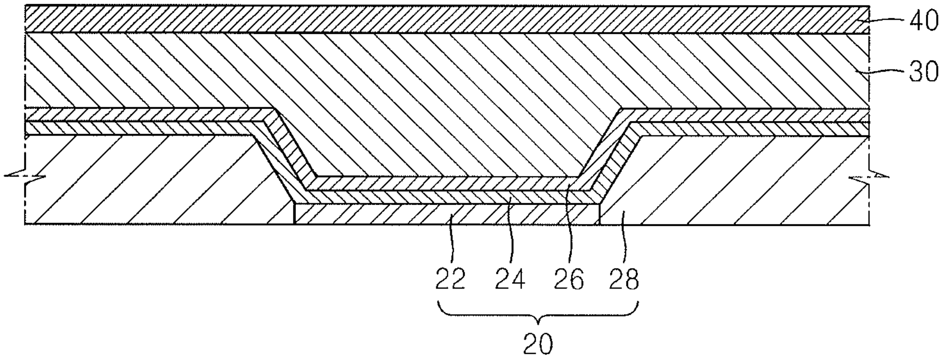
FIG. 2 is a partial cross-sectional view illustrating a part A shown in FIG. 1.

FIG. 1 is a schematic cross-sectional view illustrating an organic light emitting diode (OLED) display according to an embodiment, and FIG. 2 is a partial cross-sectional view illustrating a part A shown in FIG. 1.

In the example embodiment shown in FIGS. 1 and 2, an organic light emitting unit 20 is formed on one side of a substrate 10 and a laminate including a first inorganic film 30 and a second inorganic film 40 is formed on the substrate 10 in such a way that the laminate covers the organic light emitting unit 20. The laminate is configured to prevent the permeation of oxygen or moisture to the organic light emitting unit 20.

The substrate 10 may be a substrate formed of, e.g., glass but is not limited thereto and may be a substrate formed of, e.g., one of metal or plastic. Also, the substrate 10 may be a flexible (bendable) substrate.

The organic light emitting unit 20 formed on the substrate 10, as shown in FIG. 2, includes a laminate formed of a first electrode 22, a second electrode 26, and an organic emission film 24 interposed between the first electrode 22 and the second electrode 26.

The organic light emitting unit 20 includes one pixel circuit for each pixel and the pixel circuit may include at least one thin film transistor (not shown) and a capacitor (not shown).

The first electrode 22 is electrically connected to the thin film transistor.

The first electrode 22 and the second electrode 26 face each other and are electrically insulated by the organic emission film 24 from each other. The edge of the first electrode 22 may be covered by an insulating film 28, and the organic emission film 24 and the second electrode 26 are formed above the insulating film 28 and the first electrode 22. The second electrode 26 may be formed as a common electrode to cover the whole pixels, and the first electrode 22 may be formed as an independent structure for each pixel.

The first electrode 22 and the second electrode 26 may function as an anode and a cathode, respectively, or polarities thereof may be mutually reversed.

When the first electrode 22 is used as an anode, a material whose work function has a high absolute value is used as the first electrode 22. When the second electrode 26 is used as a cathode, a material whose work function has an absolute value lower than that of the first electrode 22 is used as the second electrode 26. When the polarities of the first electrode 22 and the second electrode 26 are reversed, the materials may be used in reverse. Hereinafter, there will be described a case in which the first electrode 22 is used as an anode and the second electrode 26 is used as a cathode.

The first electrode 22 may be formed to include at least one transparent metallic oxide of ITO, IZO, ZnO, and $In_2O_3$. The second electrode 26 may be formed to include at least one metal of Al, Ag, Mg, and Cr.

In the case of a bottom-emission structure displaying an image in a direction of the substrate 10, a thickness of the second electrode 26 is formed to be relatively great in such a way that light emitting efficiency in the direction of the substrate 10 increases.

In case of a top-emission structure displaying an image in a direction of the first inorganic film 30, the thickness of the second electrode 26 is formed to be small in such a way that the second electrode 26 may be made to be a semi-transmission reflecting film or may be formed of a transparent conductive material in addition to that described above. In this case, the first electrode 22 may further include a reflecting film.

The organic emission film 24 is formed as a stack structure of a plurality of organic films including an emissive layer. Between the emissive layer and the second electrode 26, there may be provided an electron transporting layer, an electron injecting layer, etc.

In the present embodiment shown in FIGS. 1 and 2, the organic light emitting unit 20 is sequentially covered by the first inorganic film 30 and the second inorganic film 40, thereby being sealed by the laminate of the first inorganic film 30 and the second inorganic film 40 to be shielded from the air.

The first inorganic film 30 is formed on the substrate 10 and the organic light emitting unit 20 to cover the organic light emitting unit 20.

The second inorganic film 40 is formed on the first inorganic film 30 in such a way that the second inorganic film 40 is provided to be in contact with the first inorganic film 30 in a planar direction.

The first inorganic film 30 and the second inorganic film 40 include low temperature phase transition (LPT) inorganic materials.

The inorganic films 30 and 40 may be formed by melting and solidification. A phase transition temperature of the inorganic films 30 and 40 may be lower than a modification temperature of the organic emission film 24. In this case, the occurrence of phase transitions of the inorganic films 30 and 40 designates that the LPT inorganic materials forming the inorganic films 30 and 40 are made to have viscosity and/or fluidity. Accordingly, the phase transition temperature of the inorganic films 30 and 40 designates a least temperature capable of providing the viscosity and/or fluidity to the inorganic films 30 and 40. The modification temperature of the organic emission film 24 designates a temperature causing a physical modification and/or a chemical modification of a material included in the organic emission film 24.

The LPT inorganic materials forming the first and second inorganic films 30 and 40 may include a vitric material including SnO. The vitric material may further include at least one of $P_2O_5$, $BPO_4$, $SnF_2$, and $WO_3$, in addition to SnO.

The first inorganic film 30 may be formed to cover the organic light emitting unit 20. The second inorganic film 40, as shown in FIG. 1, may be formed to be broader than the first inorganic film 30 in such a way that the edge thereof is in contact with the substrate 10. Accordingly, the first inorganic film 30 may be completely covered by the second inorganic film 40. In this case, since the second inorganic film 40 is in contact with the substrate 10, connection characteristics between the second inorganic film 40 and the substrate 10 may be improved and it may be possible to more strongly shield against permeation of the air into the organic light emitting unit 20.

The first inorganic film 30 and the second inorganic film 40 may be manufactured by using a method as follows.

As shown in FIG. 2, the first inorganic film 30 and the second inorganic film 40 are formed on the second electrode 26.

The first inorganic film 30 may be formed by using LPT inorganic materials under oxygenic (oxygen containing) conditions, and the second inorganic film 40 may be formed by using the LPT inorganic materials under anoxic conditions. The LPT inorganic materials may include a vitric material that may include SnO. The vitric material may further include at least one of $P_2O_5$, $BPO_4$, $SnF_2$, and $WO_3$, in addition to SnO.

As detailed examples, the first inorganic film 30 may be formed by using SnO of 100 wt % under oxygenic conditions. In another implementation, the first inorganic film 30 may be formed by adding $P_2O_5$ of 20 wt % to SnO of 80 wt % under oxygenic conditions. In another implementation, the first inorganic film 30 may be formed by adding $BPO_4$ of 10 wt % to SnO of 90 wt % under oxygenic conditions. In another implementation, the first inorganic film 30 may be formed by adding $SnF_2$ of 30 to 60 wt % and $P_2O_5$ of 10 to 30 wt % to SnO of 20 to 50 wt % under oxygenic conditions. In another implementation, the first inorganic film 30 may be formed by adding $SnF_2$ of 30 to 60 wt %, $P_2O_5$ of 10 to 30 wt %, and NbO of 1 to 5 wt % to SnO of 20 to 50 wt % under oxygenic conditions. In another implementation, the first inorganic film 30 may be formed by adding $SnF_2$ of 30 to 60 wt %, $P_2O_5$ of 10 to 30 wt %, and $WO_3$ of 1 to 5 wt % to SnO of 20 to 50 wt % under oxygenic conditions.

The first inorganic film 30 may be formed on the second electrode 26 by using, e.g., sputtering, vapor deposition, low-temperature deposition, plasma-enhanced chemical vapor deposition (PECVD), plasma ion-assisted deposition, electron beam coating, or ion plating methods. In detail, inorganic materials composed of $SnO—SnF_2—P_2O_5$-$WO_3$ may be formed by using sputtering under conditions with a certain amount of oxygen. As the sputtering method, a dual rotary target method is applied and a method of scanning a moving substrate may be used. Argon plasma of 12 kw and 0.15 to 1 Pa may be used, an amount of injected oxygen to that of argon may be 0.005 to 1:1, and it is possible to obtain a desired thickness of film by repeating the scanning a plurality of times. The thickness of the first inorganic film 30 may be about 100 to about 500 nm. The first inorganic film 30 includes $SnO_2$ formed by using the LPT inorganic materials under oxygenic conditions.

The second inorganic film 40 is formed on the first inorganic film 30 and may be formed by using the LPT inorganic materials under anoxic conditions.

The LPT inorganic materials may include a vitric material that may include SnO. The vitric material may further include $P_2O_5$, $BPO_4$, $SnF_2$, or $WO_3$, in addition to SnO.

As detailed examples, the second inorganic film 40 may be formed by using SnO of 100 wt % under anoxic conditions. In another implementation, the second inorganic film 40 may be formed by adding $P_2O_5$ of 20 wt % to SnO of 80 wt % under anoxic conditions. In another implementation, the second inorganic film 40 may be formed by adding $BPO_4$ of 10 wt % to SnO of 90 wt % under anoxic conditions. In another implementation, the second inorganic film 40 may be formed by adding $SnF_2$ of 30 to 60 wt % and $P_2O_5$ of 10 to 30 wt % to SnO of 20 to 50 wt % under anoxic conditions. In another implementation, the second inorganic film 40 may be formed by adding $SnF_2$ of 30 to 60 wt %, $P_2O_5$ of 10 to 30 wt %, and NbO of 1 to 5 wt % to SnO of 20 to 50 wt % under anoxic conditions. In another implementation, the second inorganic film 40 may be formed by adding $SnF_2$ of 30 to 60 wt %, $P_2O_5$ of 10 to 30 wt %, and $WO_3$ of 1 to 5 wt % to SnO of 20 to 50 wt % under anoxic conditions.

The second inorganic film 40 may be formed on the second electrode 26 by using, e.g., sputtering, vapor deposition, low-temperature deposition, plasma-enhanced chemical vapor deposition (PECVD), plasma ion-assisted deposition, electron beam coating, or ion plating methods. In detail, inorganic materials composed of $SnO—SnF_2—P_2O_5$-$WO_3$ may be formed by sputtering under anoxic conditions. As the sputtering method, a dual rotary target method is applied and a method of scanning a moving substrate may be used. Argon plasma of 12 kw and 0.15 to 1 Pa may be used, and it is possible to obtain a desired thickness of film by repeating scanning a plurality of times. The thickness of the second inorganic film 40 may be 500 nm or more.

Though the second inorganic film 40 is formed by using LPT inorganic materials under anoxic conditions, the LPT inorganic materials may combine with oxygen in the air. Accordingly, the second inorganic film 40 has a relatively high proportion of $SnO_2$ to a certain depth from a top surface and has a high proportion of SnO in a position adjacent to an interface of the first inorganic film 30. That is, the first inorganic film 30 formed under oxygenic conditions includes $SnO_2$ and the top surface of the second inorganic film 40 includes $SnO_2$ at a top surface thereof, formed by combining with oxygen in the air. From the $SnO_2$ at the top surface to the interface with the first inorganic film 30, the second inorganic film may include SnO. A proportion of SnO, relative to $SnO_2$, may be larger in the second inorganic film 40 near the interface with the first organic film 30 than adjacent to the $SnO_2$ top surface of the second inorganic film 40. In an implementation, the concentration of SnO, relative to $SnO_2$, may form a gradient in the second inorganic film 40. By including $SnO_2$, the first and second inorganic films 30 and 40 may have dense-barrier characteristics, and light transmittance thereof may be improved.

A healing process and a post-treatment process may be selectively performed on the first and second inorganic films 30 and 40.

The healing process is a process of heating the first and second inorganic films 30 and 40 at a temperature higher than the phase transition temperature to provide fluidity. The phase transition temperature is a least temperature capable of providing the fluidity to the LPT inorganic materials and is a temperature less than the modification temperature of the organic emission film 24. Accordingly, in the healing process, a temperature a heat applied to the first and second inorganic films 30 and 40 is within a range from the phase transition temperature of the LPT inorganic materials, or more, to a temperature less than the modification temperature of the organic emission film 24. The temperature to which the first and second inorganic films 30 and 40 is raised may be determined to be higher than the phase transition temperature of the LPT inorganic materials by about 0 to about 30° C. and may be, for example, within a range from about 40 to about 150° C.

The healing process may be performed under one of vacuum, nitrogenous atmosphere, or argon atmosphere, may use an IR oven, and may be performed in 1 to 3 hours.

The healing process as described above may not be finished in one operation but may be performed through a plurality of steps.

After the healing process, the post-treatment process may be performed by, e.g., chemical treatment, plasma treatment, high-temperature oxygenic chamber treatment, high-temperature moisture chamber treatment, and/or surficial doping. By the post-treatment process, a binding force between the first inorganic film 30 and the second inorganic film 40 and binding forces among the LPT inorganic materials may be improved.

As described above, in the present embodiment, since an oxidation reaction of the first and the second inorganic films 30 and 40 is previously induced under oxygenic conditions to form the first inorganic film 30 to a certain thickness and then the second inorganic film 40 is formed, oxygen in the air reacts with the LPT inorganic materials of the second inorganic film 40 before reacting with the second electrode 26. Also, since the first inorganic film 30 previously oxidized is formed on the second electrode 26, it is possible to protect the second electrode 26 from being oxidized by oxygen in the air or oxidized by oxygen permeating during the healing process.

Figure 3:
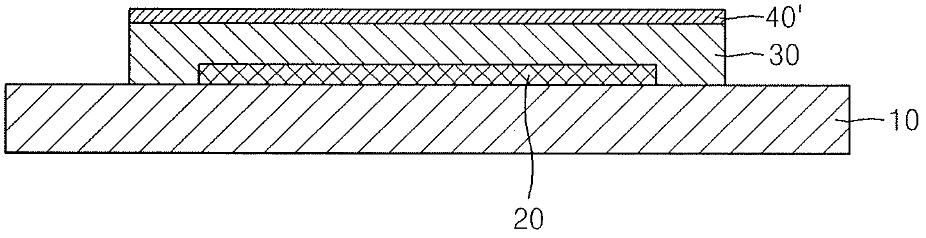
FIG. 3 is a schematic cross-sectional view illustrating an OLED display according to another embodiment.

FIG. 3 is a schematic cross-sectional view illustrating an OLED display according to another embodiment.

Referring to FIG. 3, different from FIG. 1, a second inorganic film 40' may be formed to be disposed directly on the first inorganic film 30. The first inorganic film 30 may include $SnO_2$ previously formed under oxygenic conditions, and the first inorganic film 30 may function as a barrier film for preventing an oxidation reaction between the second electrode 26 and oxygen in the air.

By way of summation and review, OLED displays may be deteriorated due to permeation of oxygen or moisture. Accordingly, sealing structures may be provided to prevent the permeation of oxygen or moisture.

As described above, embodiments may provide an organic light emitting diode (OLED) display with excellent sealing characteristics.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An organic light emitting diode display, comprising:

a substrate;

an organic light emitting unit disposed on the substrate and including a laminate of a first electrode, an organic emission film, and a second electrode;

a first inorganic film formed on the substrate to cover the organic light emitting unit, the first inorganic film including $SnO_2$; and a second inorganic film formed on the first inorganic film, the second inorganic film including $SnO_2$ at a top surface and including SnO, a proportion of the SnO increasing in a direction from the top surface of the second inorganic film toward the first inorganic film.

2. The display as claimed in claim 1, wherein the first inorganic film and the second inorganic film further include one or more of $P_2O_5$, $BPO_4$, $SnF_2$, or $WO_3$.

3. The display as claimed in claim 1, wherein the second inorganic film is formed to cover the first inorganic film and the substrate.

4. The display as claimed in claim 1, wherein the second inorganic film is formed directly on the first inorganic film.

5. The display as claimed in claim 1, wherein the first inorganic film and the second inorganic film have a phase transition temperature from a solid state to a liquid state that is lower than a modification temperature of the organic emission film.

6. The display as claimed in claim 1, wherein the first inorganic film and the second inorganic film are treated by melting and solidification.

7. The display as claimed in claim 1, wherein the first inorganic film has a thickness of about 100 nm to about 500 nm.

8. A method of manufacturing an organic light emitting diode display, the method comprising:

forming an organic light emitting unit on a substrate;

forming a first inorganic film by using a low-temperature phase transition (LPT) inorganic material under oxygenic conditions to cover the organic light emitting unit; and forming a second inorganic film on the first inorganic film by using the LPT inorganic material under anoxic conditions.

9. The method as claimed in claim 8, wherein the first inorganic film includes $SnO_2$.

10. The method as claimed in claim 8, wherein the LPT inorganic material includes:

SnO;

SnO and $P_2O_5$;

SnO and $BPO_4$;

SnO, $SnF_2$, and $P_2O_5$;

SnO, $SnF_2$, $P_2O_5$, and NbO; or

SnO, $SnF_2$, $P_2O_5$, and $WO_3$.

11. The method as claimed in claim 8, wherein the forming of the first inorganic film and the forming of the second inorganic film are performed by one or more of a sputtering method, a vapor deposition method, a low-temperature deposition method, a plasma-enhanced chemical vapor deposition method, a plasma ion-assisted deposition method, an electron beam coating method, or an ion plating method.

12. The method as claimed in claim 8, wherein the first inorganic film is formed using the sputtering method, and, in the forming of the first inorganic film using the sputtering method, a ratio between injection amounts of oxygen and argon is about 0.005 to about 1:1.

13. The method as claimed in claim 8, wherein a top surface of the second inorganic film is oxidized by oxygen in air.

14. The method as claimed in claim 8, wherein the first inorganic film has a thickness of about 100 nm to about 500 nm.

15. The method as claimed in claim 8, further comprising, after the forming of the second inorganic film:

performing a healing process of providing fluidity to the first inorganic film and the second inorganic film by heating the first inorganic film and the second inorganic film at a temperature higher than a phase transition temperature thereof; and performing a post-treatment process on the display.

16. The method as claimed in claim 15, wherein the post-treatment process includes one or more of a chemical treatment, a plasma treatment, a high-temperature oxygenic chamber treatment, a high-temperature moisture chamber treatment, or a surficial doping.

* * * * *